(12) United States Patent
Kim et al.

(10) Patent No.: US 7,807,017 B2
(45) Date of Patent: Oct. 5, 2010

(54) ETCHING APPARATUS FOR SUBSTRATES

(75) Inventors: Jung-Sub Kim, Yongin-si (KR); Dae-Soon Yim, Suwon-si (KR); Seung-Lyong Bok, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 610 days.

(21) Appl. No.: 11/688,591

(22) Filed: Mar. 20, 2007

(65) Prior Publication Data
US 2008/0017313 A1 Jan. 24, 2008

(30) Foreign Application Priority Data
Jun. 5, 2006 (KR) ............ 10-2006-0050500

(51) Int. Cl.
*H01L 21/306* (2006.01)
*H01L 21/02* (2006.01)
(52) U.S. Cl. .......... 156/345.11; 134/151; 134/902; 134/154
(58) Field of Classification Search ........... 134/151, 134/154, 198, 199, 902; 156/345.11, 345.17, 156/345.33
See application file for complete search history.

(56) References Cited

U.S. PATENT DOCUMENTS

| | | | |
|---|---|---|---|
| 5,817,185 A | * | 10/1998 | Shindo et al. ............ 134/25.4 |
| 6,199,568 B1 | * | 3/2001 | Arai et al. ............... 134/186 |
| 6,240,938 B1 | * | 6/2001 | Oshinowo ............... 134/147 |
| 6,911,097 B1 | | 6/2005 | Chen et al. |
| 7,243,911 B2 | * | 7/2007 | Abiko et al. ............. 261/122.1 |
| 2005/0097771 A1 | * | 5/2005 | Yi et al. .................. 34/444 |
| 2008/0017313 A1 | * | 1/2008 | Kim et al. ............... 156/345.11 |

FOREIGN PATENT DOCUMENTS

JP 64-55828 3/1989
JP 3-38037 2/1991

OTHER PUBLICATIONS

JP1055828—English Abstract corresponding to JP64-55828.
JP3038037—English Abstract corresponding to JP3-38037.

* cited by examiner

*Primary Examiner*—Sylvia R. MacArthur
(74) *Attorney, Agent, or Firm*—F. Chau & Associates, LLC

(57) ABSTRACT

An etching apparatus for substrates includes an etching tank including an etching solution, a cassette having a plurality of substrates mounted therein and which is installed inside the etching tank, a porous plate installed on a lower surface of the cassette and a plurality of discharge sections provided in the porous plate corresponding to the substrates and each of the discharge sections having a plurality of discharge ports. The etching apparatus further includes a plurality of first lines connected to the discharge ports respectively, and supplied with a gas to provide bubbles to the substrates through the discharge ports. The first lines are divided into a plurality of groups, and at least one group is supplied with a gas having a pressure different from a pressure of a gas supplied to other groups.

19 Claims, 14 Drawing Sheets

ETCHING APPARATUS FOR SUBSTRATES

CROSS-REFERENCE TO RELATED APPLICATION

This application relies for priority upon Korean Patent Application No. 2006-50500 filed on Jun. 5, 2006, the contents of which are hereby incorporated by reference herein in their entirety.

BACKGROUND OF THE INVENTION

1. Technical Field

The present disclosure relates to an etching apparatus. More particularly, the present disclosure relates to an etching apparatus for substrates using an etching solution.

2. Description of the Related Art

Typically, a flat display device includes one of the following devices such as, for example, a liquid crystal display (LCD), a plasma display panel (PDP), or an organic light emitting diode (OLED). The flat display device is used for various display devices, such as, for example, a large-sized television (TV), a monitor of a lap-top computer, and a mobile phone.

A flat display device is provided with substrates. For example, in an LCD using liquid crystals, two transparent glass substrates are disposed opposite to each other and the liquid crystals are interposed therebetween. Moreover, due to the recent trend of making the flat display device lighter in weight and thinner in size, studies have been conducted for developing a thin flat display device. For example, these studies have been aimed at producing a thin flat display device, by for example, reducing the thickness of the substrate of these devices. In this regard, to reduce the thickness of the substrate an etching technique for the substrate has been developed. According to this etching technique, the substrate is etched using an etching solution, thereby reducing the thickness of the substrate.

However, one using the above-mentioned conventional etching technique may encounter the following difficulties set forth below:

First, the substrate may not be uniformly etched, which may in turn result in the display device having defects in image quality during the operation of the display device.

Second when a certain region of the substrate is excessively etched, the corresponding region of the substrate may become thin, and thus the substrate may become damaged during the etching process. For example, when a plurality of substrates are etched at the same time, if any one of the substrates is damaged, debris from the damaged substrate may cause the neighboring substrates to be damaged as well.

SUMMARY OF THE INVENTION

The exemplary embodiments of the present invention provide an etching apparatus for substrates, capable of etching a plurality of substrates at a uniform thickness at the same time.

In accordance with an exemplary embodiment of the present invention, an etching apparatus for substrates is provided. The etching apparatus includes an etching tank including an etching solution, a cassette having a plurality of substrates mounted therein and which is installed inside the etching tank, a porous plate installed on a lower surface of the cassette, and a plurality of discharge sections provided in the porous plate corresponding to the substrates, in which each of the discharge sections includes a plurality of discharge ports. The etching apparatus further includes a plurality of first lines connected to the discharge ports, respectively, and supplied with a gas to provide bubbles to the substrates through the discharge ports. In addition, the first lines are divided into a plurality of groups, and at least one group is supplied with a gas having a pressure different from a pressure of a gas supplied to other groups.

Here, the etching apparatus may further include a plurality of second lines, which are connected to the plurality of groups, respectively, and supply the same pressure of gas to the first lines belonging to the same group.

According to this embodiment of the present invention, the pressure of the supplied gas is adjusted depending on a position of each substrate, thereby changing the amount of supplied bubbles. Thus, the substrates can be etched at a uniform thickness.

In accordance with an exemplary embodiment of the present invention, an etching apparatus for substrates is provided. The etching apparatus includes an etching tank including an etching solution, a cassette having a plurality of substrates mounted therein and which is installed inside the etching tank, and a plurality of partitions provided in the cassette and separating the substrates from each other. The etching apparatus further includes a porous plate installed on a lower surface of the cassette a plurality of discharge sections provided in the porous plate corresponding to the substrates, in which each of the discharge sections has a plurality of discharge ports and a plurality of first lines connected to the discharge ports, respectively, and supplied with a gas to provide bubbles to the substrates through the discharge ports.

According to this embodiment of the present invention, the partitions separate the substrates from each other so that debris of the substrate does not cause damage to the other substrates even if one of the substrates is damaged.

BRIEF DESCRIPTION OF THE DRAWINGS

Exemplary embodiments of the present invention can be understood in more detail from the following description taken in conjunction with the accompanying drawings, in which.

DESCRIPTION OF THE EXEMPLARY EMBODIMENTS

Figure 1:
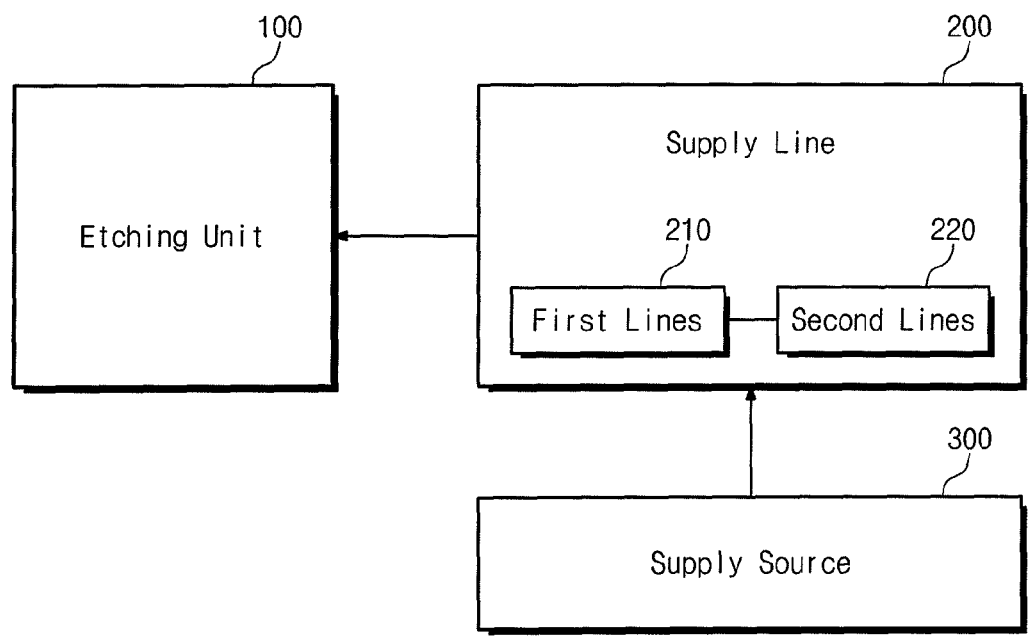
FIG. 1 is a schematic view illustrating a construction of an etching apparatus for substrates according to an exemplary embodiment of the present invention.

Hereinafter, the exemplary embodiments of the present invention will be explained in detail with reference to the accompanying drawings. However, the scope of the present invention is not limited to such exemplary embodiments and the present invention may be realized in various forms. In addition the size of layers and regions shown in the drawings can be simplified or magnified for the purpose of clear explanation. Also, the same reference numerals are used to designate the same elements throughout the drawings.

FIG. 1 is a schematic view illustrating the construction of an etching apparatus for substrates according to an exemplary embodiment of the present invention.

Referring to FIG. 1, the etching apparatus includes an etching unit 100 a supply line 200, and a supply source 300. In the etching unit 100, at least one substrate is etched using an etching solution. While the substrate is being etched in the etching unit 100, gas is supplied to the etching unit 100, thereby providing bubbles to the substrate. The gas is delivered to the etching unit 100 through the supply source 300 and the supply line 200. The supply line 200 includes first lines 210 connected to the etching unit 100, and second lines 220 connected to the supply source 300.

Figure 2:
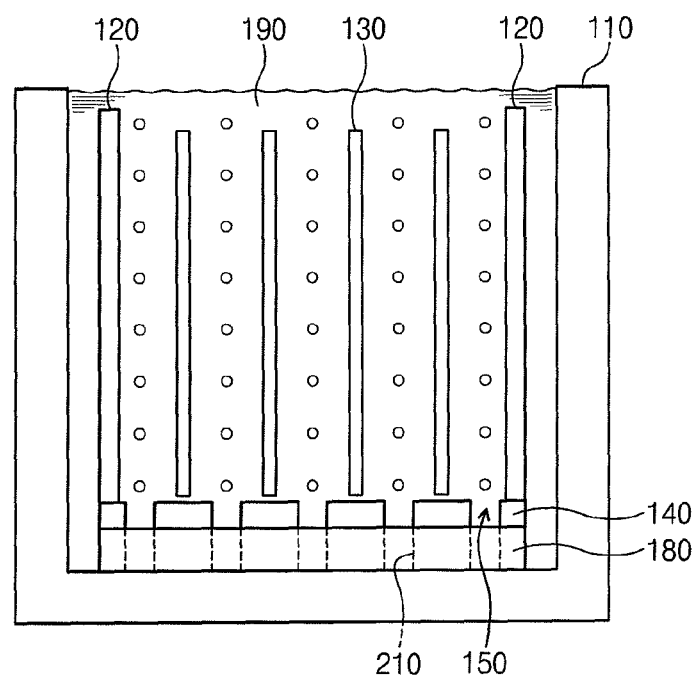
FIG. 2 is a sectional view illustrating a structure of the etching unit of FIG. 1.

FIG. 2 is a sectional view illustrating a structure of the etching unit of FIG. 1.

Referring to FIG. 2, the etching unit 100 includes an etching tank 110, substrates 130, a cassette 120, and a porous plate 140. The substrates 130 are etched using the etching unit 100. The etching tank 110 includes a container in which an etching solution 190 is contained. The etching tank 110 has various shapes, such as, for example, a cylindrical shape or a hexahedral shape having an opened top surface, so as to allow the etching solution 190 to be contained therein. The substrates 130 to be etched are loaded or unloaded through the opened top surface of the etching tank 110.

The substrates 130 are used for a display device. If the display device is a liquid crystal display, each substrate 130 includes, for example, transparent glass or plastic. Here, a pair of substrates 130 are adhered such that the upper substrate is opposite to the lower substrate and the pair of substrates 130 are etched. When etched, the outer surfaces opposite to the inner surfaces of the paired substrates 130 are etched by an etching solution.

The plurality of substrates 130 are loaded and etched at the same time. To this end, the cassette 120 is used. The number of substrates 130 that are etched at the same time is generally from, for example, about 10 pieces to about 20 pieces, but it may be about 10 pieces or less or 20 pieces or more if necessary. The cassette 120 has an opened upper surface, and the plurality of substrates 130 are mounted in the cassette 120 parallel to opposite sides of the cassette 120. The substrates 130 are inserted and mounted through the opened upper surface of the cassette 120.

The porous plate 140 is installed to a lower surface of the cassette 120, and is provided with a plurality of discharge ports 150 regularly. The porous plate 140 may be, for example, integrally formed to the cassette 120, or be mounted to the lower surface of the cassette 120 after formed apart from the cassette 120. To mount the porous plate 140 to the cassette 120 for example, the lower surface of the cassette 120 is opened with its edge left behind, and then the porous plate 140 is seated onto the edge of lower surface of the cassette 120.

Meanwhile, to mount the substrates 130 in the cassette 120, for example, a guide having grooves parallel to opposite sides of the cassette 120 is installed, and then the substrates 130 are inserted into the grooves. Further, another guide having grooves is installed to the porous plate 140, and then the substrates 130 are inserted into the grooves.

The etching solution 190 is filled in the etching tank 110 to a level higher than the height of the cassette 120. The etching solution 190 can be sequentially filled from the bottom to the top using a separate supply device. The etching solution 190 reacts with the substrates 130 mounted in the cassette 120. For example, in the case where the substrates 130 to be etched are glass substrates used in the LCD, the etching solution 190 contains hydrofluoric acid. Each substrate 130 is etched by chemical reaction of hydrofluoric acid with components of glass, and thus each substrate 130 experiences a reduction in its thickness.

The opposite surfaces of each substrate 130 are supplied with bubbles through the discharge ports 150 that are provided in the porous plate 140 The bubbles are provided to remove by-products accumulated on the surfaces of each substrate 130. The by-products are generated by chemical reaction of the substrates 130 with the etching solution 190. When the by-products are accumulated on the surfaces of each substrate 130, the chemical reaction of the substrates 130 with the etching solution 190 is obstructed.

To generate the bubbles, air or inert gas such as, for example, nitrogen is mainly used, and is delivered through the supply line 200. A bubble plate 180 connecting the supply line 200 and the porous plate 140 can be provided between the bottom of the etching tank 110 and the porous plate 140. The bubble plate 180 serves as an intermediate medium, which connects the first lines 210 of the supply line 200 with the discharge ports 150 of the porous plate 140. The bubble plate 180 may be integrally formed with the porous plate 140.

Figure 3:
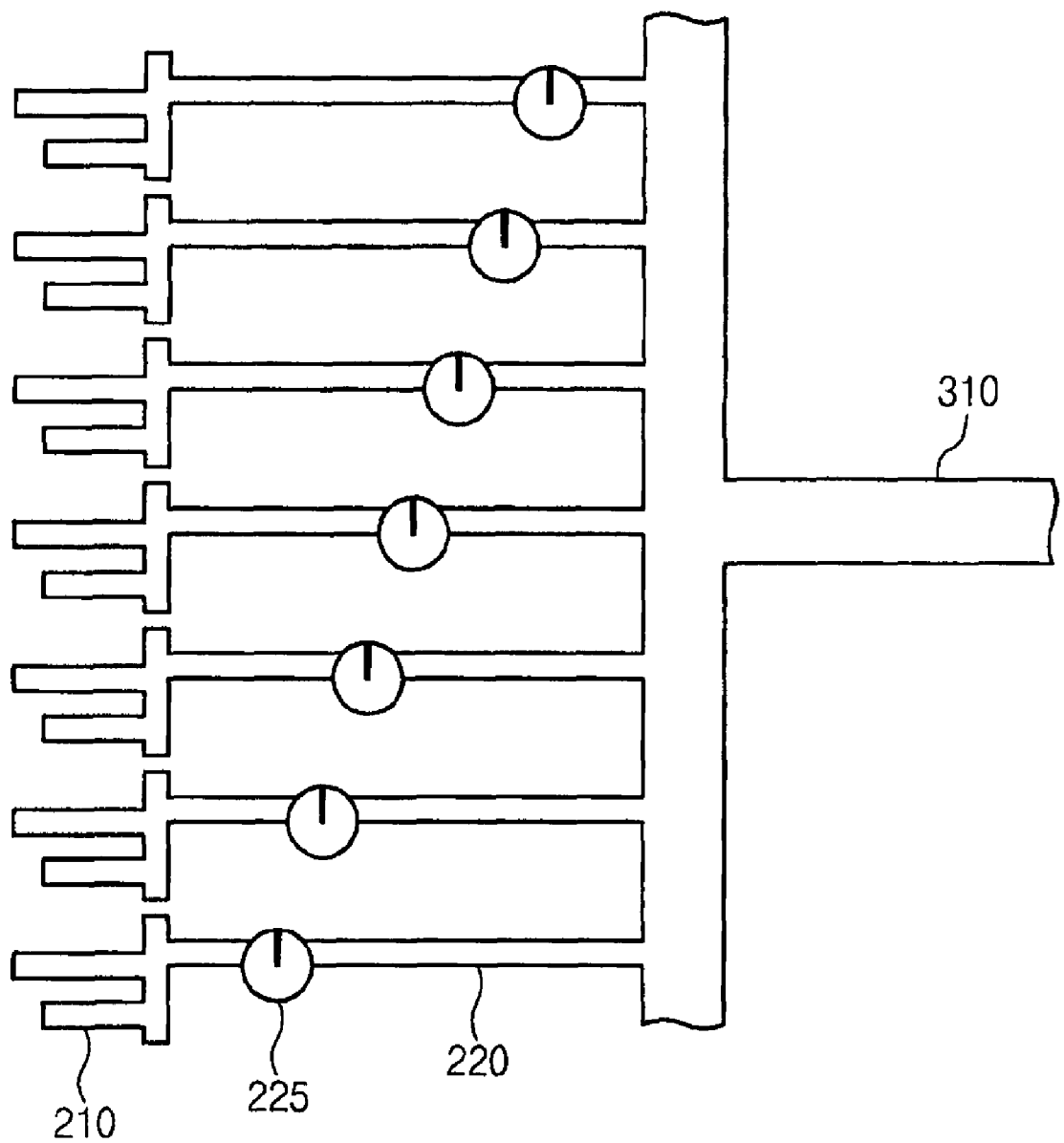
FIG. 3 is a sectional view illustrating a structure of the supply line of FIG. 1.

FIG. 3 is a sectional view illustrating a structure of the supply line of FIG. 1.

Referring to FIG. 3, the supply line 200 includes the first lines 210, which are connected to the discharge ports 150, respectively. Further, the supply line 200 includes the second lines 220, each of which bundles the first lines 210 in part. The second lines 220 bundle the first lines 210, and divide all the first lines 210 into a plurality of groups, each of which consists of some of the first lines 210. The second lines 220 branch off from a main line 310, which is directly connected to the supply source 300.

The second lines 220 are provided with pressure regulators 225, respectively. Each pressure regulator 225 may include for example, a flowmeter and a pressure gauge. The flowmeter regulates the pressure of the gas delivered through each second line 220. For example, an operator can regulate the flow rate and the pressure of the gas by, for example, widening or narrowing a channel of each second line 220. The pressure regulator indicates the pressure of the current gas that is being delivered.

As illustrated in FIG. 3, when two of the first lines 210 branch off from each second line 220, the same pressure of gas is delivered to the two first lines 210, which branch off from each second line 220. Further the pressures of the gases delivered to the different first lines 210, which branch off from the different second lines 220, can be regulated differently.

The first lines 210 correspond to the discharge ports 150 of the porous plate 140, respectively. Hence, when the first lines 210 are divided into groups, the discharge ports 150 corresponding to the first lines 210 respectively are also divided into groups in the same way. When each divided group of first lines 210 has a different pressure of gas, the efficiency of removing the by-products is changed by the bubbles supplied from each divided group of discharge ports 150. In other words, the bubbles generated by delivery of the gas having higher pressure can more effectively remove the by-products accumulated on the surfaces of each substrate 130.

The amount of the by-products accumulated on the substrates 130 may vary depending on, for example, the mounting position of the substrates 130 in the cassette 120, or the regions of the substrates 130. For example, taking this difference into consideration, a higher pressure of gas is delivered to the first lines 210 corresponding to the region where a great amount of by-products is accumulated, and a lower pressure of gas is delivered to the first lines 210 corresponding to the region where a smaller amount of by-products is accumulated. In this case, the by-products are uniformly removed, and thus the substrates 130 can be etched at a uniform thickness.

In this manner, when the first lines 210 are divided into groups, the amount of by-products accumulated on the substrates 130 should be considered. On the basis of this consideration, the first lines 210 and the discharge ports 150 can be grouped in various methods as follows.

FIGS. 4A through 4E are plan views illustrating embodiments of grouping the discharge ports of the porous plate of FIG. 2.

Figure 4A:
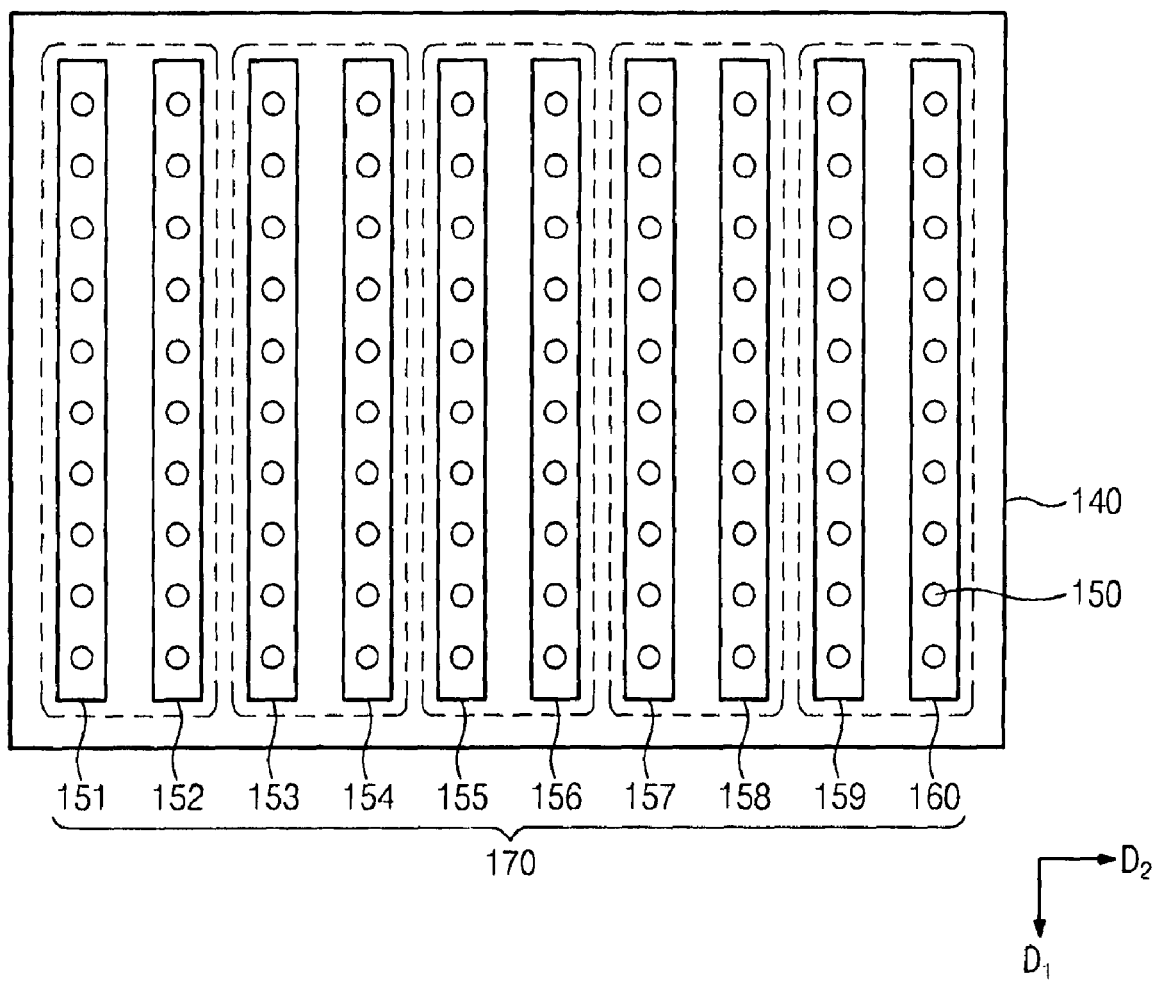
FIGS. 4A through 4E are plan views illustrating embodiments of grouping the discharge ports in the porous plate of FIG. 2.

Referring to FIG. 4A, the plurality of discharge ports 150 provided in the porous plate 140 are regularly formed in first and second directions $D_1$ and $D_2$, which are perpendicular to each other. On the assumption that the discharge ports 150 formed in the first direction $D_1$ are defined as a discharge section 170, the porous plate 140 has a plurality of discharge sections 170 formed in the second direction $D_2$. Each discharge section 170 corresponds to each substrate 130 to be etched. For example, assuming that the discharge sections 170 sequentially arranged in the second direction $D_2$ are divided into first through tenth discharge sections 151 through 160, an $n^{th}$ discharge section (n is an arbitrary natural number in a range of 1 to 10) provides the bubbles to a specific substrate 130, which is mounted adjacent to the $n^{th}$ discharge section.

In this embodiment, the discharge ports 150 are grouped in a unit of the discharge section. For example, all discharge ports 150 belonging to adjacent discharge sections (for instance, the first and second discharge sections 151 and 152) belong to the same group. The first lines 210 connected to the discharge sections 150 belonging to the same group are supplied with the same pressure of gas. This construction is applied in the case where the by-products are generated differently depending on the mounting position of the substrate 130 in the cassette 120, and thus the substrates 130 are etched at a different thickness. For example, when ten substrates 130 are etched at the same time, an etching thickness shows a small difference between the regions in the single substrate 130, but a great difference is shown between different substrates 130 depending on the mounting position of the substrates 130 in the cassette 120. In this case, the discharge ports 150, may, for example, be divided in a unit of the discharge section.

To this end, the number of discharge sections 170 belonging to the same group is variously determined. When the ten substrates 130 are etched at the same time, the etching thickness shows a small difference between the substrates 130 corresponding to the first and second discharge sections 151 and 152, while the etching thickness shows a great difference between the substrates 130 corresponding to the second and third discharge sections 152 and 153. In this case, the discharge ports 150 and the first lines 210 connected to the discharge ports 150 can be grouped on the basis of the two neighboring discharge sections 170.

If the etching thickness shows a small difference between the substrates 130 corresponding to the first, second and third discharge sections 151, 152 and 153, while the etching thickness shows a great difference between the substrates 130 corresponding to the third and fourth discharge sections 153 and 154, the discharge ports 150 and the first lines 210 connected to the discharge ports 150 can be grouped on the basis of the three neighboring discharge sections 170. Further, if the etching thickness shows a great difference between the substrates 130 corresponding to the first and second discharge sections 151 and 152, the discharge ports 150 and the first lines 210 connected to the discharge ports 150 can be grouped on the basis of any one discharge section 170

Figure 4B:
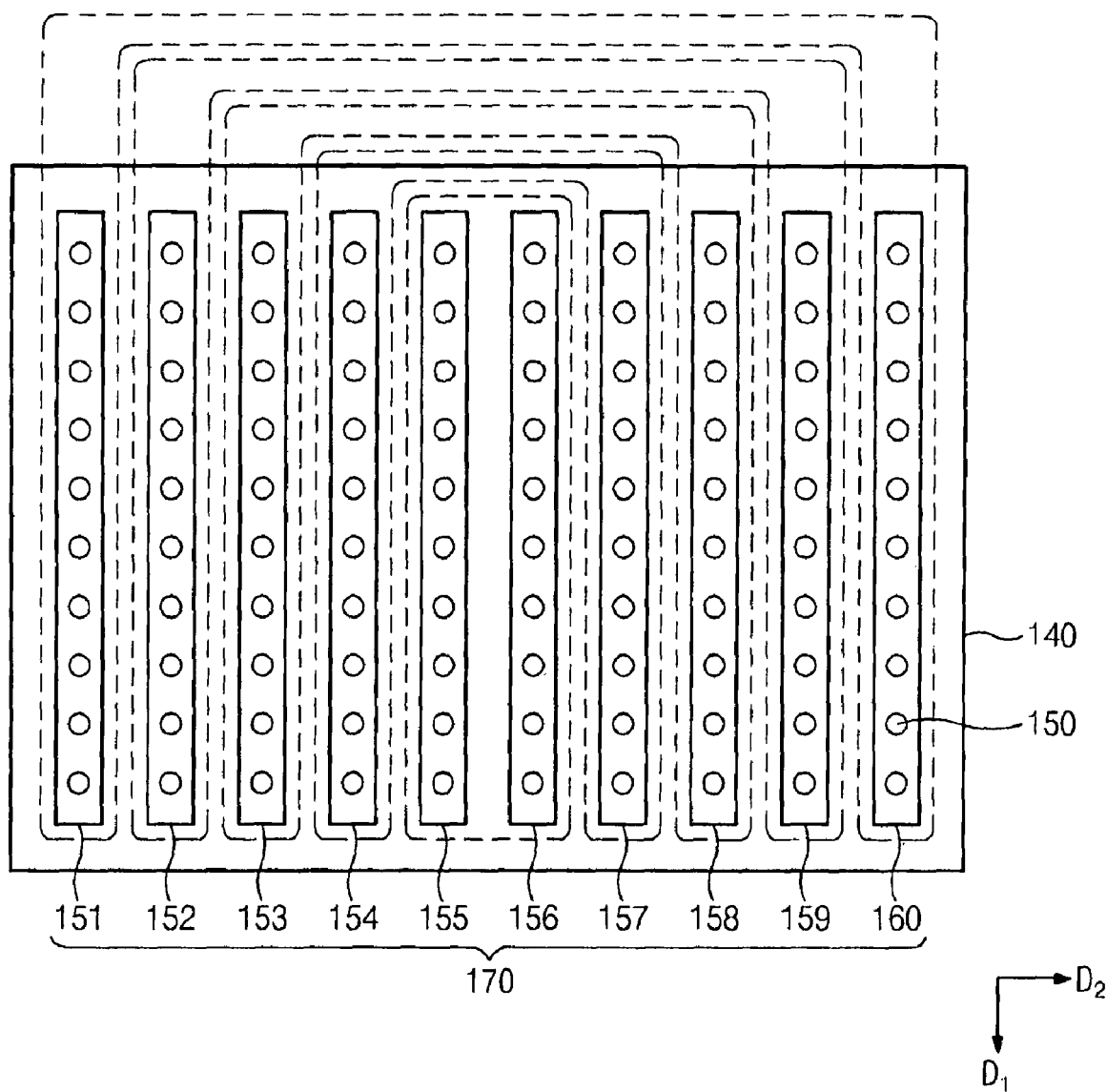

Referring to FIG. 4B, some of the discharge sections 170 belonging to the same group are interposed between the discharge sections belonging to another group. For example, the etching thickness shows a great difference between the substrates 130 mounted at the center of the cassette 120 and the substrates 130 mounted on opposite edges of the cassette 120. The discharge ports 150 belonging to the fifth and sixth discharge sections 155 and 156 that are adjacent to the center of the cassette 120 can be included in the same group, and the discharge ports 150 belonging to the discharge sections 170, for instance the third and eighth discharge sections 153 and 158, which are symmetrically disposed about the center of the cassette 120, can be included in the same group.

Here, all groups are not required to have the same number of discharge sections 170. For example, the fourth to seventh discharge sections 154 to 157 that are adjacent to the center of the cassette 120 can be included in one group. The third and eighth discharge sections 153 and 158 that are symmetrical to each other about the center of the cassette 120 can be included in another group. The first, seconds ninth and tenth discharge sections 151, 152, 159 and 160, which are located on opposite edges of the cassette 120, can be included in the other group.

Figure 4C:
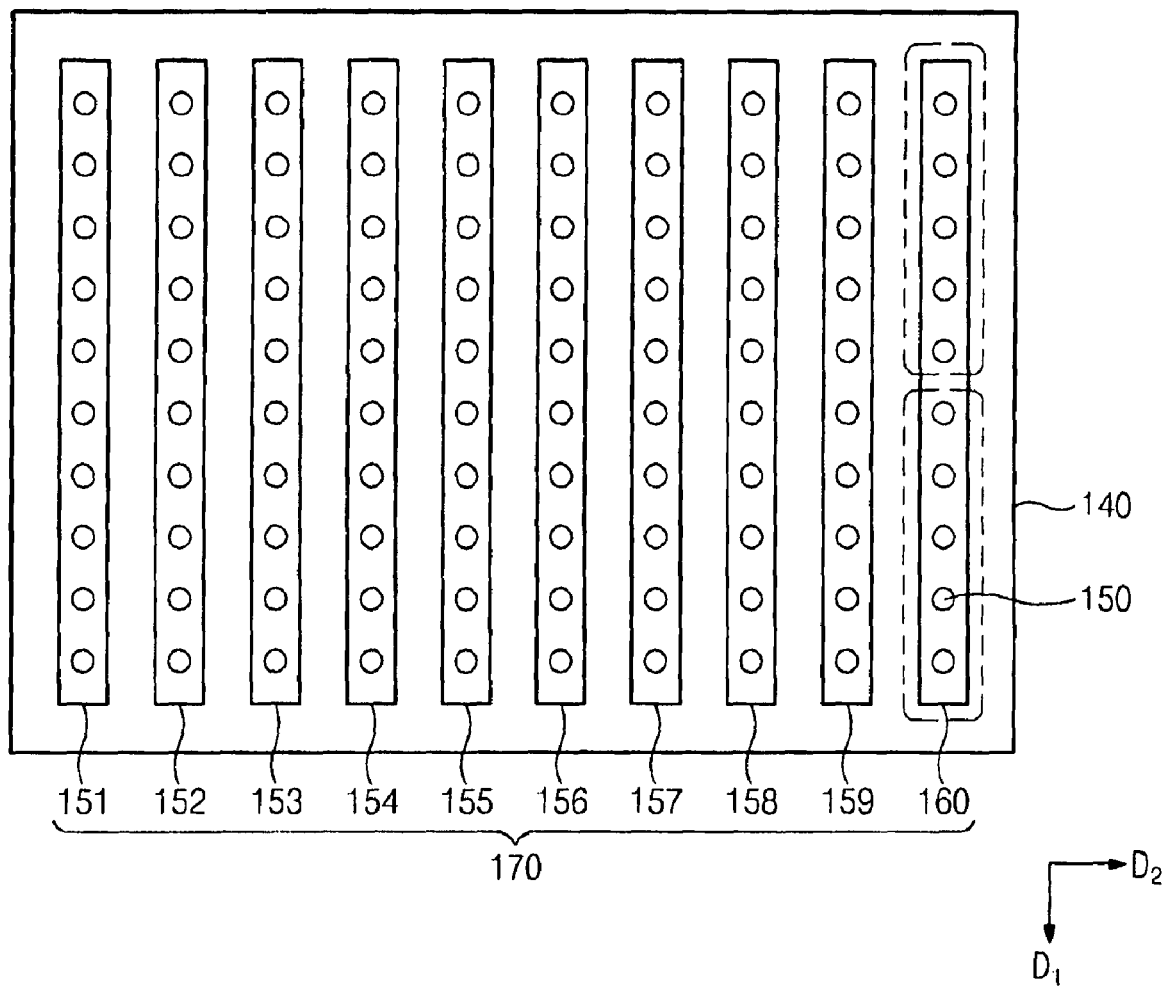

Referring to FIG. 4C, the porous plate 140 is provided with a plurality of discharge sections 170 extending in the second direction $D_2$. Each discharge section 170 includes a plurality of discharge ports 150 formed in the first direction $D_1$. Similar to the above-described embodiment, an $n^{th}$ discharge section (n is an arbitrary natural number in a range of 1 to 10) provides the bubbles to a specific substrate 130, which is mounted adjacent to the $n^{th}$ discharge section.

The discharge ports 150 are grouped as the discharge section 170. This is applied to the case where a different etching thickness is represented between the substrates 130 depending on the mounting position of the substrates 130 in the cassette 120, and the great etching thickness is represented between the regions within each substrate 130

For example as illustrated in FIG. 4C, when one discharge section 170 includes ten discharge ports 150, these discharge ports 150 belonging to the same discharge section 170 are divided into two equal pads, and thus the neighboring five discharge ports 150 can be formed into one group. The number of discharge ports 150 belonging to one group is determined depending on, for example, distribution of differences in etching thickness after the substrates 130 are etched. In other words, if the etching thickness shows a great difference between the regions within each substrate 130, the number of discharge ports 150 belonging to one group should be reduced. In the case of reducing the number of discharge ports 150 to the maximum extent, one group may include only one discharge port 150.

Figure 4D:
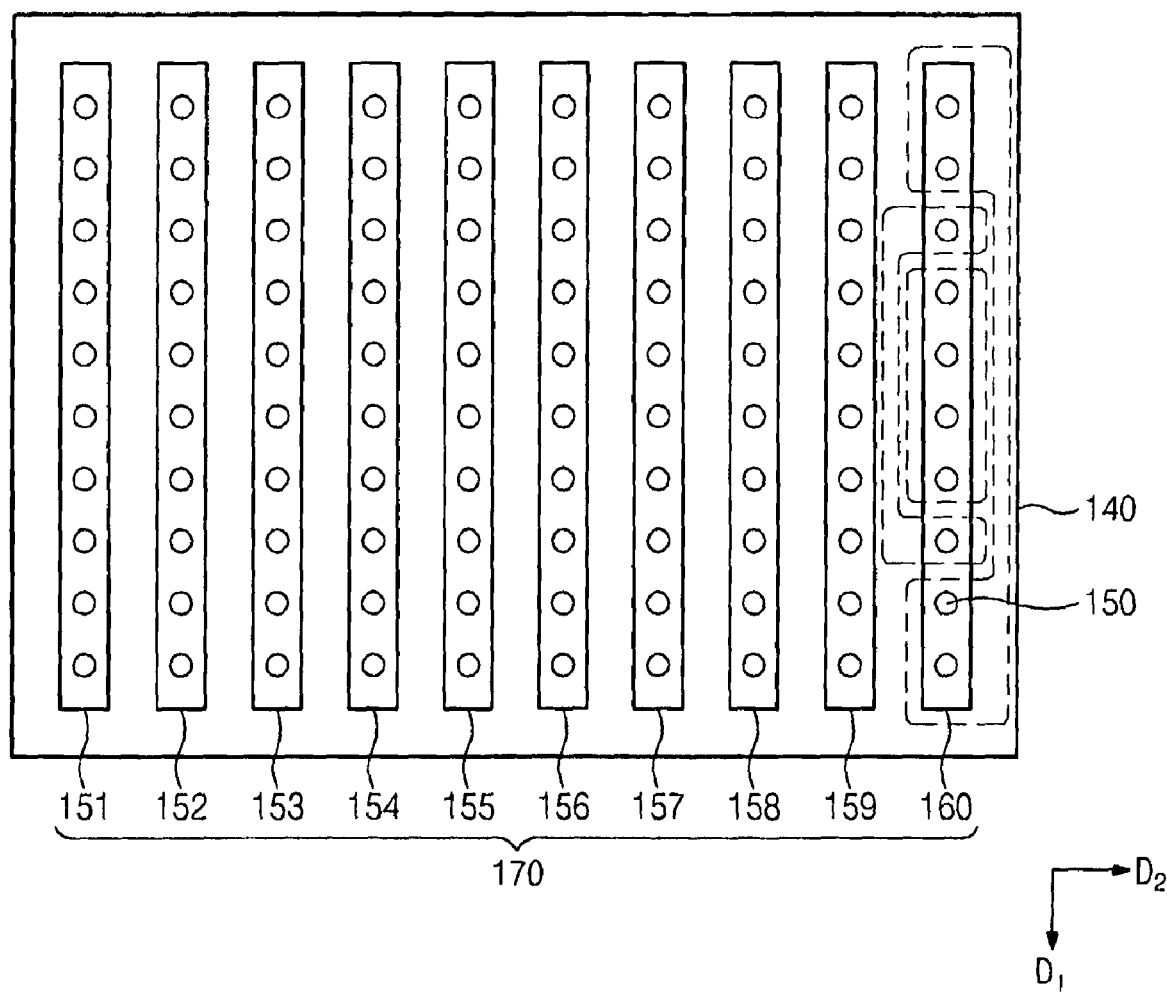
Figure 4E:
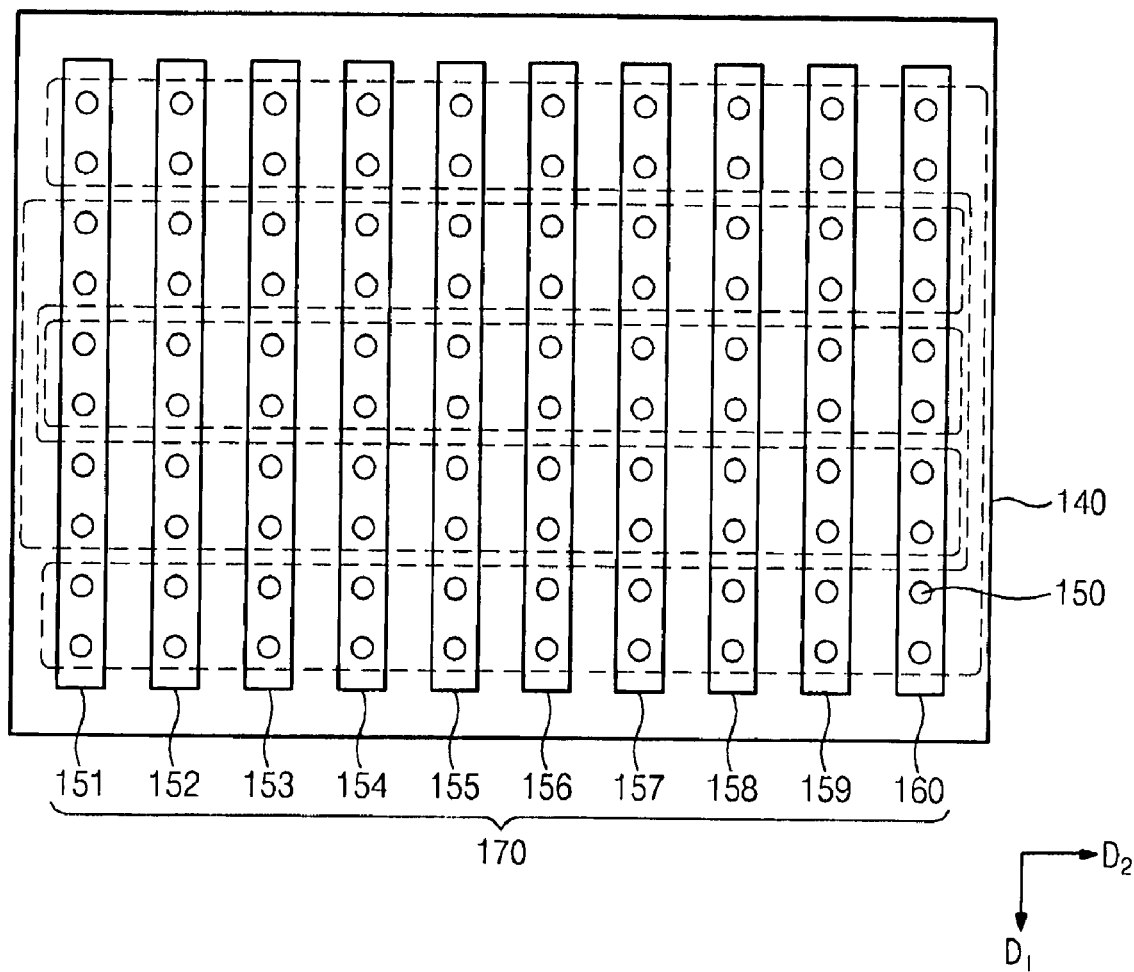

Referring to FIG. 4D, only some of the discharge ports 150 belonging to one discharge section 170 is formed into one group, and is disposed between others of the discharge ports 150 belonging to another group. For example, when the etching thickness shows a great difference between the central region and the edge region of each substrate 130, the discharge ports 150, which are located at the center of the discharge section 170, can be formed into one group, and the discharge ports 150, which are symmetrically disposed about the center of the discharge section 170, can be formed into another group.

All groups are not required to have the same number of discharge ports 150. For example, when one discharge section 170 includes ten discharge ports 150, only four discharge ports 150, which are adjacent to the center of one discharge section 170, can be formed into one group. A pair of discharge ports 150, which are adjacent to and symmetrical to each other about the center of the discharge section 170, can be formed into another group. The last four discharge ports 150, which are located on the opposite edges of the discharge section 170, can be formed into the other group.

Referring to 4E, the porous plate 140 is provided with a plurality of discharge sections 170 formed in the second direction $D_2$. Each discharge section 170 includes a plurality of discharge ports 150 formed in the first direction $D_1$. An $n^{th}$ discharge section (n is an arbitrary natural number in a range of 1 to 10) provides the bubbles to a specific substrate 130, which is mounted adjacent to the nth discharge section.

The discharge ports 150 are grouped by bundling some of the discharge ports 150 belonging to each discharge section 170. This is applied to the case where an etching thickness shows a difference between the regions within each substrate 130 regardless of the mounting position of the substrates 130 in the cassette 120. For example, this construction can be applied to the case where the etching thickness shows no difference between the substrate 130 corresponding to the first discharge section 151 and the substrate 130 corresponding to the fifth discharge section 155, but the centers and opposite edges of the two substrates 130 show the same or similar distribution of differences in etching thickness.

For example, the discharge ports 150 that are located at the center, opposite edges, and between the center and opposite edges in the first through tenth discharge sections 151 through 160 are divided into different groups.

In the embodiments illustrated in FIGS. 4A through 4D, the first lines 210 belonging to the same group are connected to at least one discharge port 150 belonging to the same discharge section 170. In contrast, in the embodiment illustrated in FIG. 4E, the first lines 210 belonging to the same group are connected to at least two discharge ports 150 belonging to different discharge sections 170. In this manner, the first lines 210 can be divided into various groups, and thus a proper pressure of gas can be supplied to each group.

Meanwhile, in the embodiments illustrated in FIGS. 4A through 4E, the substrates 130 and the discharge sections 170 have a one-to-one correspondence. However, the substrates 130 and the discharge sections 170 may have a two-to-one correspondence by interposing the substrate 130 between adjacent discharge sections 170. In this case, the discharge ports 150 belonging to each discharge section are divided into groups.

Figure 5A:
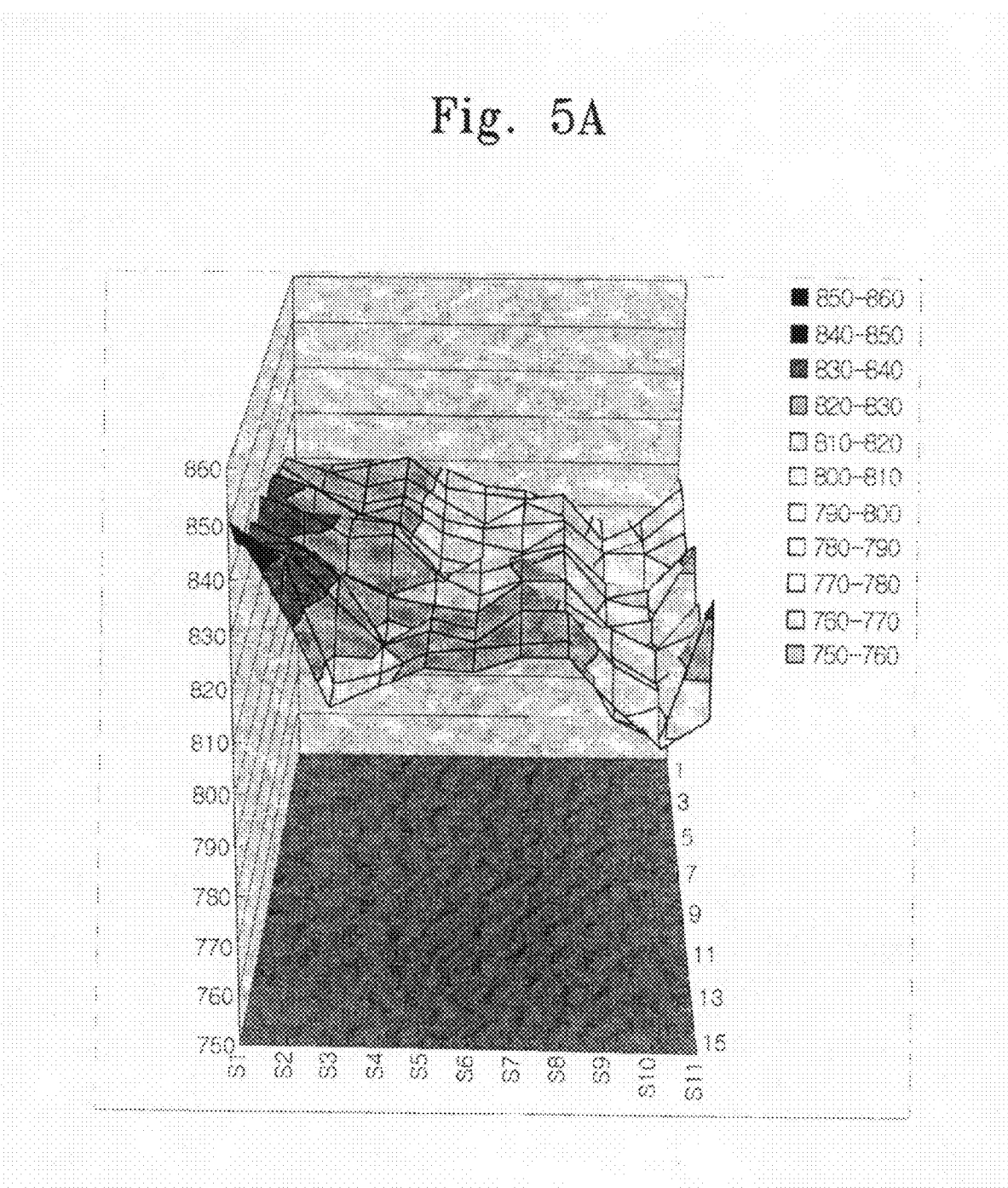
FIG. 5A is a graph showing thickness distribution on the substrate after the substrate has been etched using an etching apparatus according to a comparative example of the present invention.

FIG. 5A is a graph showing the thickness distribution on the substrate after the substrate has been etched using an etching apparatus according to a comparative example of the present invention. The etching apparatus for substrates according to the comparative example supplies a substrate (for convenience of description called a "first substrate") with bubbles caused by the same pressure of gas.

Referring to FIG. 5A, after the etching process, the first substrate has very irregular thickness distribution. In detail, the first substrate has a region having a thickness between about 810 micrometers (μm) and about 820 μm, a region having a thickness between about 820 μm and about 830 μm, and a region having a thickness between about 830 μm and about 840 μm.

Figure 5B:
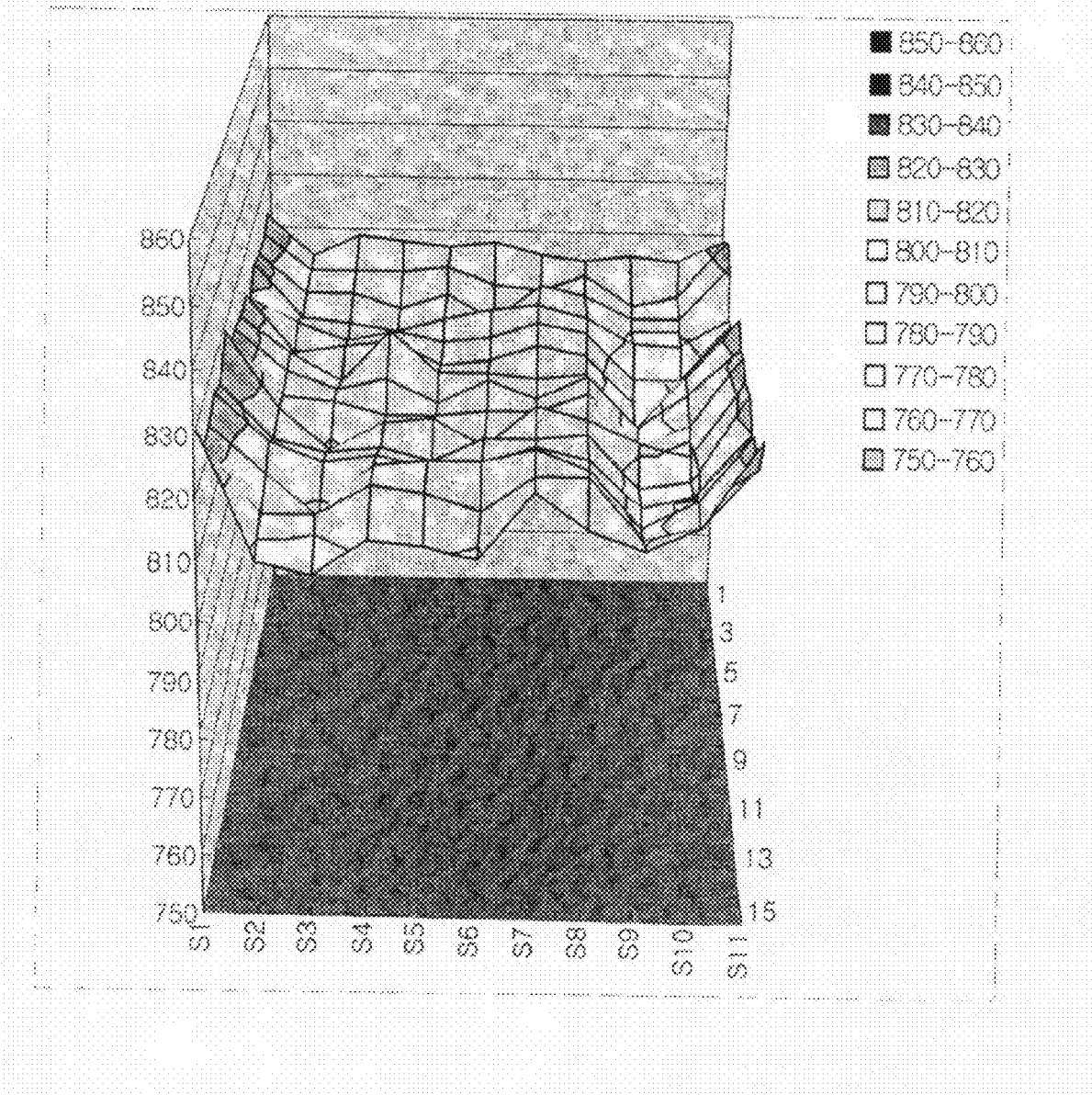
FIG. 5B is a graph showing thickness distribution on the substrate after the substrate has been etched using an etching apparatus according to an other comparative example of the present invention.

FIG. 5B is a graph showing thickness distribution on the substrate after the substrate has been etched using an etching apparatus according to another comparative example of the present invention. The etching apparatus for substrates according to another comparative example supplies regions of a substrate (for convenience of description, called a "second substrate") with different bubbles. Specifically, the discharge ports provided in the porous plate are irregularly disposed. The discharge ports are formed on a certain region at a high density, and thus a great amount of bubbles is provided to the certain region. The discharge ports are formed on another region at a low density, and thus a smaller amount of bubbles is provided to the other region. This structure is based on the principle similar to the principle applied to the embodiment of the present invention.

Referring to FIG. 5B, the second substrate has a relatively uniform thickness distribution in which most regions except a part of the whole regions have a thickness between about 810 μm and about 820 μm. Therefore, the second substrate has more uniform thickness distribution over the first substrate. According to exemplary embodiments of the present invention, the substrates can be etched to have a uniform thickness distribution.

Figure 6A:
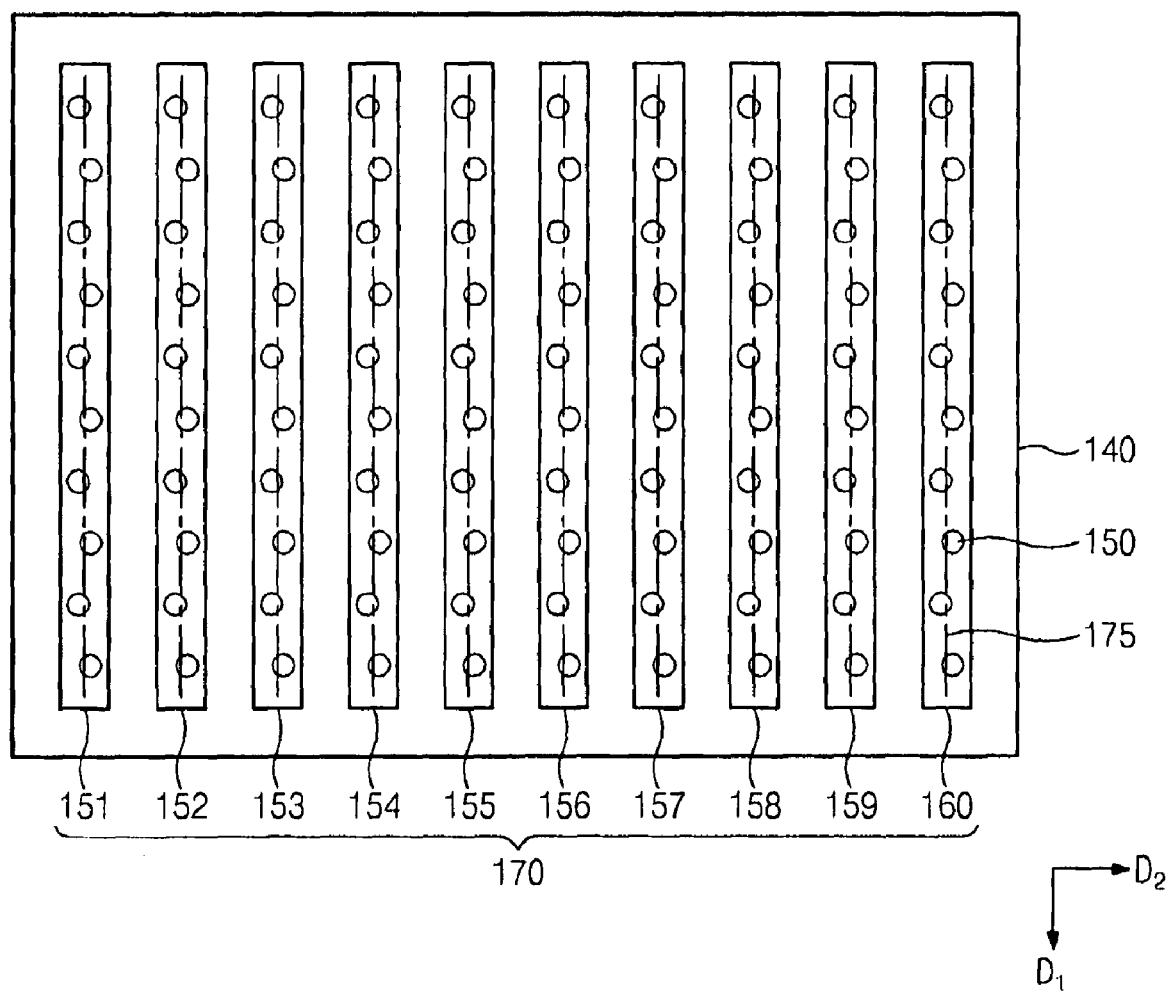
FIGS. 6A and 6B are plan views illustrating various embodiments in which discharge ports are disposed in the porous plate of FIG. 2.
Figure 6B:
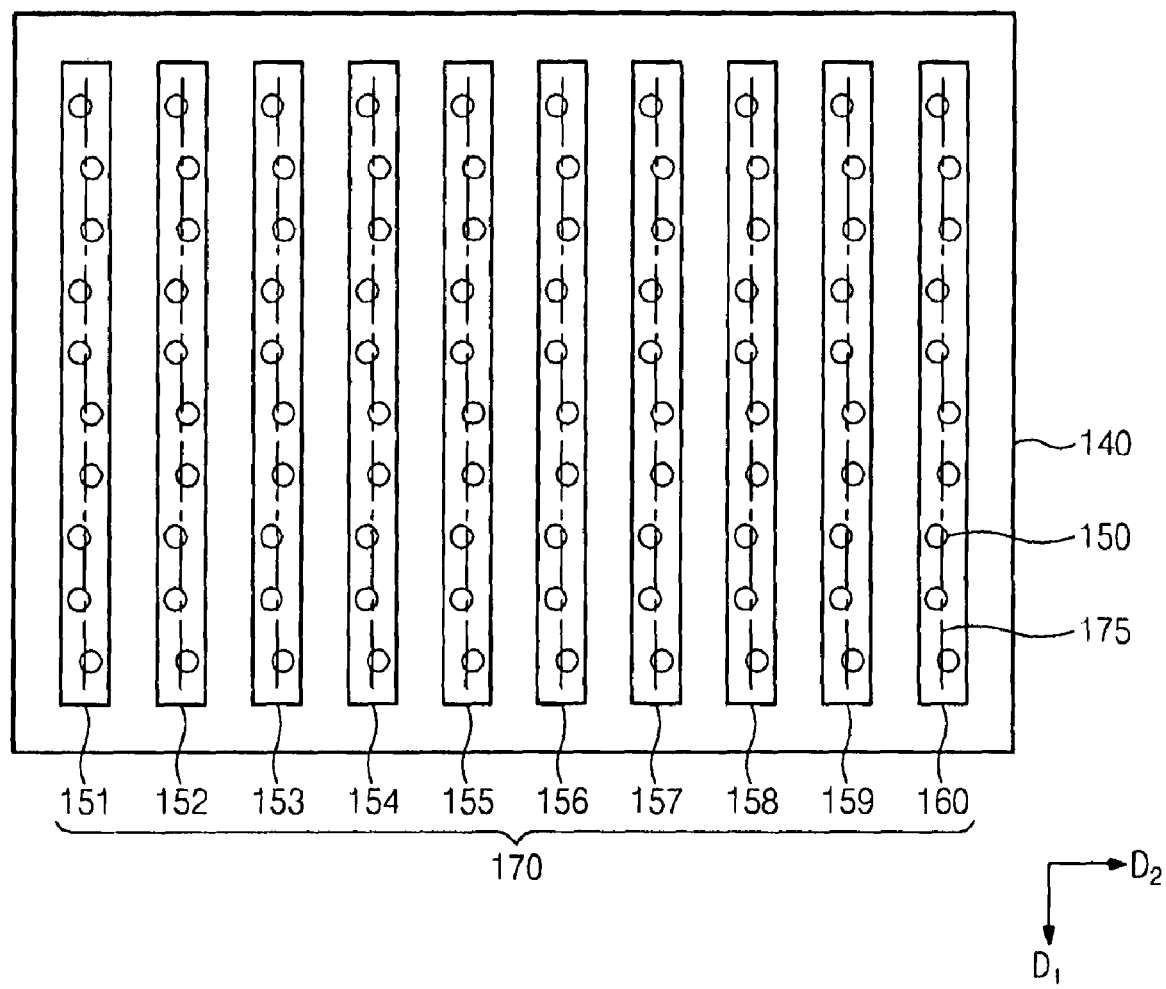

FIGS. 6A and 6B are plan views illustrating various embodiments in which discharge ports are disposed in the porous plate of FIG. 2.

Referring to FIGS. 6A and 6B, the porous plate 140 is provided with a plurality of discharge sections 170 formed in the second direction $D_2$. Each discharge section 170 includes a plurality of discharge ports 150 formed in the first direction $D_1$. Here, the first direction $D_1$ refers to a direction corresponding to a length direction of each bottom surface of the substrate 130 when the substrate 130 is mounted in the cassette 120. The second direction $D_2$ is perpendicular to the first direction $D_1$, and refers to the mounting direction of the substrates 130. Assuming that a virtual line 175 is parallel to the first direction $D_1$ on a region corresponding to the bottom surface of each substrate 130, the discharge ports 150 belonging to one discharge section 170 are uniformly disposed at both sides of the virtual line 175.

In this manner, when the discharge ports 150 belonging to one discharge section 170 are uniformly disposed at both sides of the virtual line 175 bubbles can be uniformly provided to opposite surfaces of each substrate 130 corresponding to the discharge section 170. Thus, the opposite surfaces of each substrate 130 can be uniformly etched.

In detail, as illustrated in FIG. 6A, the discharge ports 150 can, for example, be alternately disposed one by one at both sides of the virtual line 175 in a zigzag manner. Further, as illustrated in FIG. 6B, a group of discharge ports including at least one discharge port 150 can, for example, be alternately disposed at both sides of the virtual line 175 in a zigzag manner.

If the discharge ports 150 are alternately disposed in a zigzag manner the first lines 210 connected to the discharge ports 150 can be divided into groups. As a result, the supplied bubbles are adjusted depending on the mounting position of the substrates 130 in the cassette 120 or regions in the substrate 130, and thus the substrates 130 can be more uniformly etched.

Figure 7:
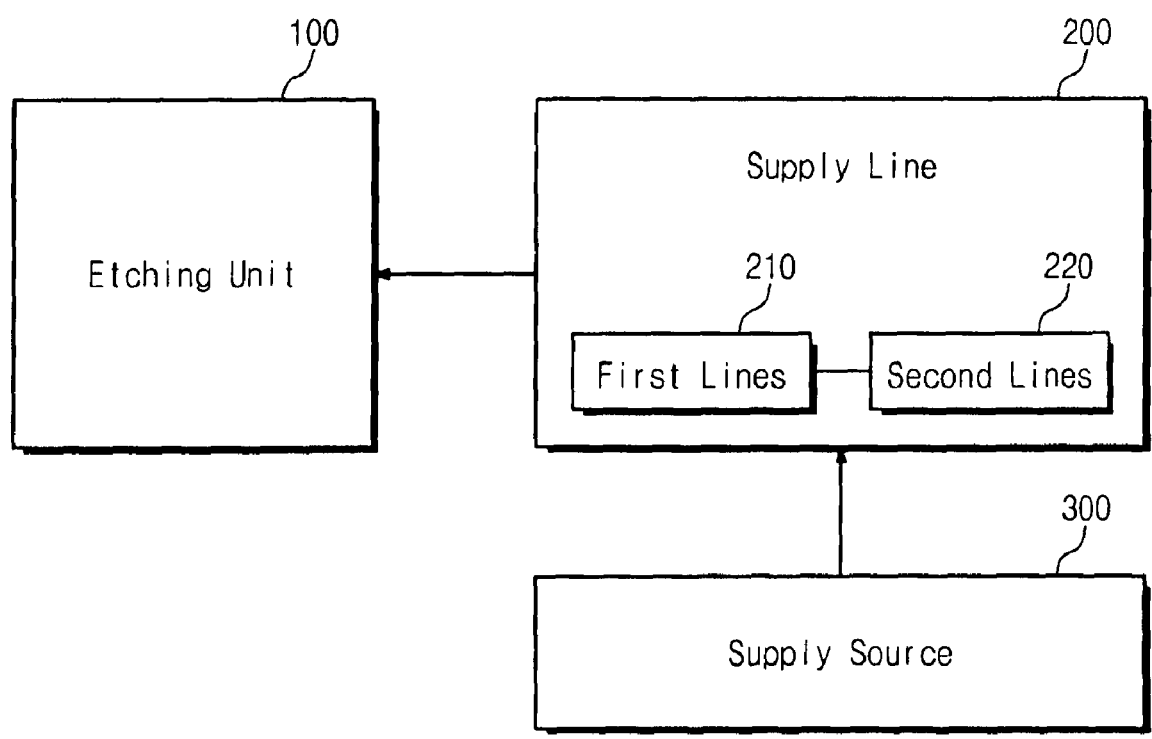
FIG. 7 is a schematic view illustrating a construction of an etching apparatus for substrates according to an exemplary embodiment of the present invention.

FIG. 7 is a schematic view illustrating a construction of an etching apparatus for substrates according to another exemplary embodiment of the present invention.

Referring to FIG. 7, the etching apparatus includes an etching unit 100, a supply line 200, and a supply source 300. In the etching unit 100, at least one substrate is etched using an etching solution. While the substrate is being etched in the etching unit 100, gas is supplied to the etching unit 100, so that bubbles are supplied to the substrate. The gas is delivered to the etching unit 100 through the supply source 300 and the supply line 200.

Figure 8:
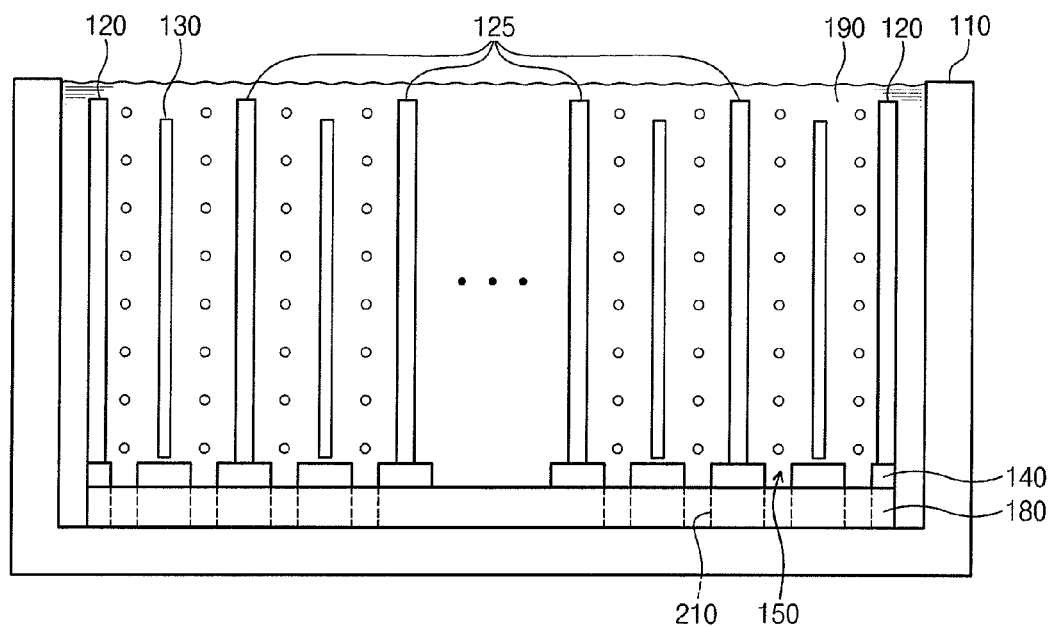
FIG. 8 is a sectional view illustrating a structure of the etching unit of FIG. 7.

FIG. 8 is a sectional view illustrating a structure of the etching unit of FIG. 7.

Referring to FIG. 8, the etching unit 100 includes an etching tank 110, substrates 130, a cassette 120 having partitions 125, and a porous plate 140. The substrates 130 are etched using the etching unit 100. The etching tank 110 includes a container in which an etching solution 190 is contained, and has an opened top surface. A plurality of substrates 130 are loaded and etched at the same time. The cassette 120 has an opened upper surface so as to allow the substrates 130 to be loaded into the etching tank 110.

The cassette 120 has the opened upper surface, and the plurality of substrates 130 are mounted in the cassette 120 parallel to opposite sides of the cassette 120. The partitions 125 of the cassette 120 separate the substrates 130 from each other. The partitions 125 are installed in correspondence with the substrates 130 one-to-one. Alternatively, one partition 125 may correspond with several substrates 130. Otherwise, the cassette 120 can be provided therein with a plurality of sub-cassettes, which can serve as the partitions 125, respectively.

The porous plate 140 is installed on a lower surface of the cassette 120, and is provided with a plurality of discharge ports 150 which are regularly aligned. The porous plate 140 may be integrally formed with the cassette 120, or can be mounted on the lower surface of the cassette 120 after the porous plate 140 has been fabricated separately from the cassette 120. To allow opposite surfaces of each substrate 130 to be uniformly etched when each substrate 130 is etched, discharge ports 150 can be variously disposed. To this end, the constructions of the embodiments described with reference to FIGS. 6A and 6B can be applied without modification.

Figure 9:
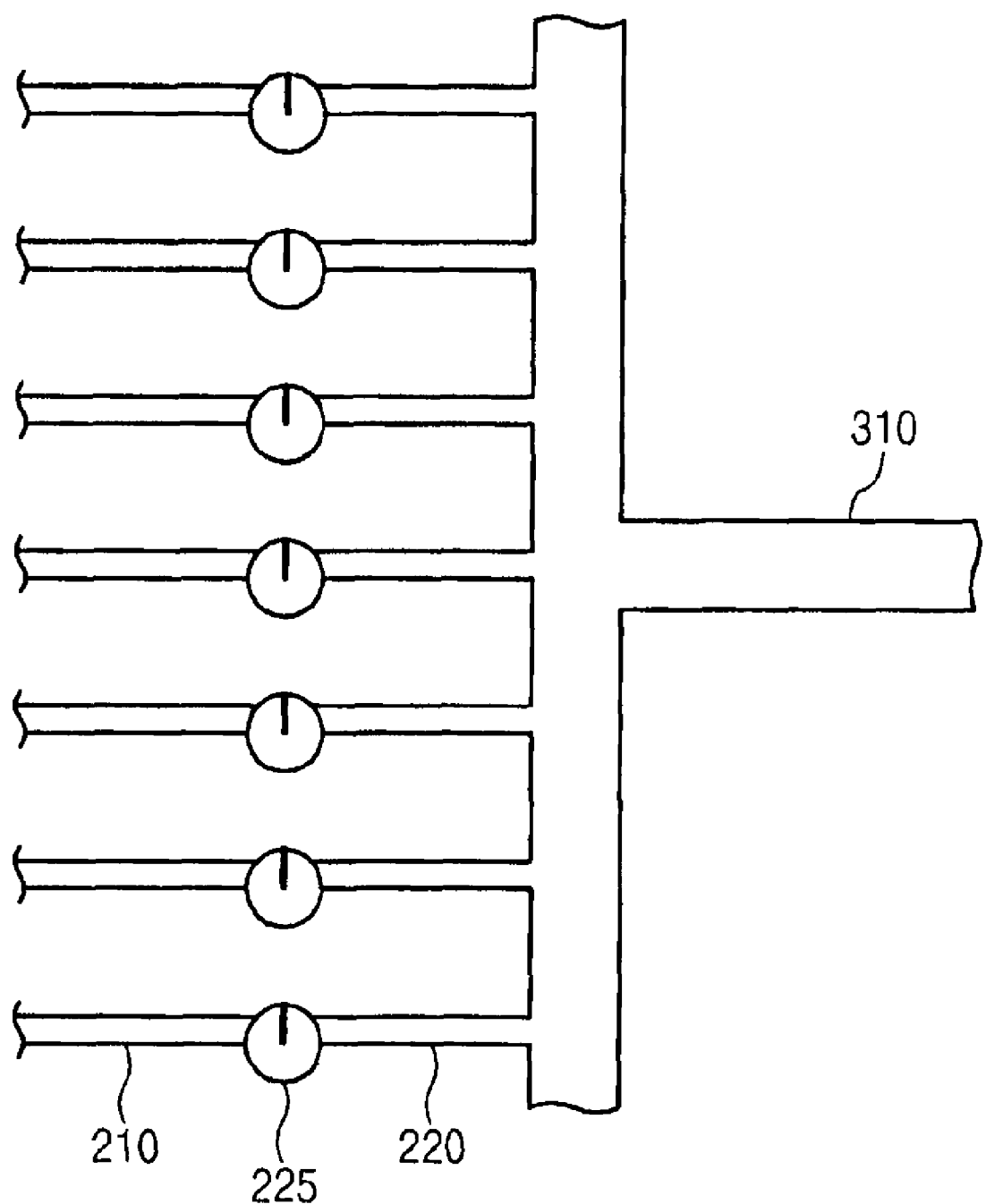
FIG. 9 is a sectional view illustrating a structure of the supply line of FIG. 7.

FIG. 9 is a sectional view illustrating a structure of the supply line of FIG. 7.

Referring to FIG. 9, the supply line 200 includes first lines 210 that are connected to the discharge ports 150 respectively, and second lines 220 that are connected to the supply source 300. The second lines 220 divide the first lines 210 into a plurality of groups by forming at least one first line 210 into one group. In FIG. 9, the first lines 210 correspond with the second lines 220 one-to-one.

The second lines 220 are additionally provided with pressure regulators 225, respectively. Each pressure regulator 225 regulates the pressure of gas delivered from the supply source 300. The same pressure of gas is delivered to all the first lines 210 that branch off from a specific one of the second lines 220. Further, the pressures of the gases delivered to the different first lines 210, which branch off from the different second lines 220, can be regulated differently.

As described above, the first lines 210 and the discharge ports 150 connected to the first lines 210 are grouped by each second line 220. To this end, the constructions of the embodiments described with reference to FIGS. 4A through 4E can be applied with no change.

Referring to FIG. 8 again, in the etching process, the substrates 130 are etched by a chemical reaction with the etching solution 190 contained in the etching tank 110. During the chemical reaction, by-products such as sludge are generated. The by-products are not accumulated on the surface of each substrate 130, but removed from surface of each substrate 130 by means of the bubbles formed by the gas delivered from the supply line 200. In the case of portions where a great amount of by-products are accumulated, the pressures of the pressure regulators 225 are highly regulated to the second lines 220 connected to the discharge ports 150 corresponding to the portions, thereby rapidly removing the by-products. In this case, the by-products can be uniformly removed, so that the substrates 130 can be etched at a uniform thickness.

As the chemical reaction is performed, some of the substrates 130 are subject to excessive reduction in etching thickness, so that they undergo cracks causing damage to the substrates 130. When debris of the damaged substrates 130 freely moves in the etching tank 110, the other substrate 130 is also damaged by the debris during the etching process. According to this embodiment, when some of the substrates 130 are damaged, the movement of the debris is restricted by the partitions 125. Therefore, although some of the substrates 130 can be damaged, the other substrates 130 mounted in the cassette 120 can be etched without damage.

As can be seen from the foregoing, according to exemplary embodiments of the present invention, the substrates can be etched at a uniform thickness at the same time. Further, although some of the substrates can be damaged during the etching process, the other substrates are not damaged.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. An etching apparatus for substrates comprising:
an etching tank including an etching solution;
a cassette having a plurality of substrates mounted therein and the cassette is installed inside the etching tank;
a porous plate installed on a lower surface of the cassette;
a plurality of discharge sections provided in the porous plate corresponding to the substrates, in which each of the discharge sections includes a plurality of discharge ports; and
a plurality of first lines connected to the discharge ports, respectively, and supplied with a gas to provide bubbles to the substrates through the discharge ports,
wherein the first lines are divided into a plurality of groups; and
a plurality of second lines connected to the plurality of groups, respectively and wherein the plurality of second lines are adapted to supply at least one group with a gas having a pressure different from a pressure of a gas supplied to other groups.

2. The etching apparatus of claim 1, wherein the plurality of second lines connected to the plurality of groups, supply a same pressure of gas to the first lines belonging to a same group.

3. The etching apparatus of claim 1, wherein the first lines belonging to a same group are connected to at least one discharge port belonging to a same discharge section.

4. The etching apparatus of claim 1, wherein the first lines belonging to a same group are connected to at least two discharge ports belonging to different discharge sections.

5. The etching apparatus of claim 1, wherein the first lines belonging to each group are different in number.

6. The etching apparatus of claim 1, wherein the second lines further include pressure regulators, respectively.

7. The etching apparatus of claim 1, wherein the first lines are directly connected with the discharge ports.

8. The etching apparatus of claim 1, wherein the discharge ports belonging to a same discharge section are aligned in parallel to a length direction of a bottom surface of a substrate corresponding to the same discharge section.

9. The etching apparatus of claim 8, wherein the discharge sections are interposed between the substrates.

10. The etching apparatus of claim 1, wherein the discharge ports belonging to each discharge section are disposed on opposite sides of each substrate on a basis of a bottom surface of the substrate corresponding to the each discharge section when viewed from a top of the etching tank.

11. The etching apparatus of claim 10, wherein the discharge ports are disposed on opposite sides of the substrate in a zigzag manner.

12. An etching apparatus for substrates comprising: an etching tank including an etching solution;
a cassette having a plurality of substrates mounted therein and the cassette is installed inside the etching tank;
a plurality of partitions provided in the cassette and separating the substrates from each other;
a porous plate installed on a lower surface of the cassette;
a plurality of discharge sections provided in the porous plate corresponding to the substrates, in which each of the discharge sections has a plurality of discharge ports; and
a plurality of first lines connected to the discharge ports, respectively, and supplied with a gas to provide bubbles to the substrates through the discharge ports,
wherein the first lines are divided into a plurality of groups; and
a plurality of second lines connected to the plurality of groups, respectively and wherein the plurality of second lines are adapted to supply at least one group with a gas having a pressure different from a pressure of a gas supplied to other groups.

13. The etching apparatus of claim 12, wherein the plurality of second lines connected to the plurality of groups, respectively, so as to supply a same pressure of a gas to the first lines.

14. The etching apparatus of claim 12, wherein the first lines belonging to a same group are connected to at least one discharge port belonging to a same discharge section.

15. The etching apparatus of claim 12, wherein the first lines belonging to a same group are connected to at least two discharge ports belonging to different discharge sections.

16. The etching apparatus of claim 12, wherein the discharge ports belonging to a same discharge section are aligned in parallel to a length direction of a bottom surface of the substrate corresponding to the same discharge section.

17. The etching apparatus of claim 12, wherein the discharge ports belonging to each discharge section are disposed on opposite sides of each substrate on a basis of a bottom surface of the substrate corresponding to the each discharge section when viewed from a top of the etching tank.

18. The etching apparatus of claim 12, wherein at least one of the substrates is disposed between the partitions.

19. The etching apparatus of claim 18, wherein each of the partitions has a size that is equal to or greater than a size of each of the substrates.

* * * * *